US012165935B2

(12) United States Patent
Lin et al.

(10) Patent No.: US 12,165,935 B2
(45) Date of Patent: Dec. 10, 2024

(54) PHYSICAL VAPOR DEPOSITION PROCESS APPARATUS AND METHOD OF OPTIMIZING THICKNESS OF A TARGET MATERIAL FILM DEPOSITED USING THE SAME

(71) Applicant: TAIWAN SEMICONDUCTOR MANUFACTURING COMPANY, LTD., Hsinchu (TW)

(72) Inventors: Chen-Hung Lin, Taipei (TW); Ya-Chin Chiu, Taichung (TW); Ming-Hsien Lin, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 619 days.

(21) Appl. No.: 17/462,769

(22) Filed: Aug. 31, 2021

(65) Prior Publication Data
US 2023/0067466 A1 Mar. 2, 2023

(51) Int. Cl.
*H01L 21/66* (2006.01)
*C23C 14/06* (2006.01)
(Continued)

(52) U.S. Cl.
CPC .............. *H01L 22/26* (2013.01); *C23C 14/35* (2013.01); *C23C 14/545* (2013.01); *H01J 37/3402* (2013.01); *H01J 37/3426* (2013.01); *H01J 37/3455* (2013.01); *H01J 37/3479* (2013.01); *H01L 21/2855* (2013.01); *C23C 14/0641* (2013.01); *C23C 14/185* (2013.01);
(Continued)

(58) Field of Classification Search
CPC . C23C 14/185; C23C 14/0641; C23C 14/545; C23C 14/35; H01L 21/2855; H01L 22/26
See application file for complete search history.

(56) References Cited

U.S. PATENT DOCUMENTS 6,132,565 A 10/2000 Lin
10,190,209 B2 1/2019 Kao et al.
(Continued)

FOREIGN PATENT DOCUMENTS

WO 2012/015993 A2 2/2012
WO 2019/217046 A1 11/2019

*Primary Examiner* — Kelly M Gambetta
(74) *Attorney, Agent, or Firm* — STUDEBAKER & BRACKETT PC

(57) ABSTRACT

Embodiments are directed to a method of optimizing thickness of a target material film deposited on a semiconductor substrate in a semiconductor processing chamber, wherein the semiconductor processing chamber includes a magnetic assembly positioned on the semiconductor processing chamber, the magnetic assembly including a plurality of magnetic columns within the magnetic assembly. The method includes operating the semiconductor processing chamber to deposit a film of target material on a semiconductor substrate positioned within the semiconductor processing chamber, measuring an uniformity of the deposited film, adjusting a position of one or more magnetic columns in the magnetic assembly, and operating the semiconductor processing chamber to deposit the film of the target material after adjusting position of the one or more magnetic columns.

20 Claims, 13 Drawing Sheets

(51) Int. Cl.
  *C23C 14/18* (2006.01)
  *C23C 14/35* (2006.01)
  *C23C 14/54* (2006.01)
  *H01J 37/34* (2006.01)
  *H01L 21/285* (2006.01)

(52) U.S. Cl.
  CPC ............... *H01J 2237/24564* (2013.01); *H01J 2237/3323* (2013.01)

(56) References Cited

U.S. PATENT DOCUMENTS

| | | |
|---|---|---|
| 2011/0240466 A1 | 10/2011 | Ritchie et al. |
| 2019/0035611 A1* | 1/2019 | Chung ................ H01J 37/3405 |
| 2021/0351024 A1* | 11/2021 | Sun ..................... H01J 37/3455 |
| 2022/0081756 A1* | 3/2022 | Hou ........................ C23C 14/18 |

* cited by examiner

PHYSICAL VAPOR DEPOSITION PROCESS APPARATUS AND METHOD OF OPTIMIZING THICKNESS OF A TARGET MATERIAL FILM DEPOSITED USING THE SAME

BACKGROUND

Physical vapor deposition (PVD), or sputtering, is a process used in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
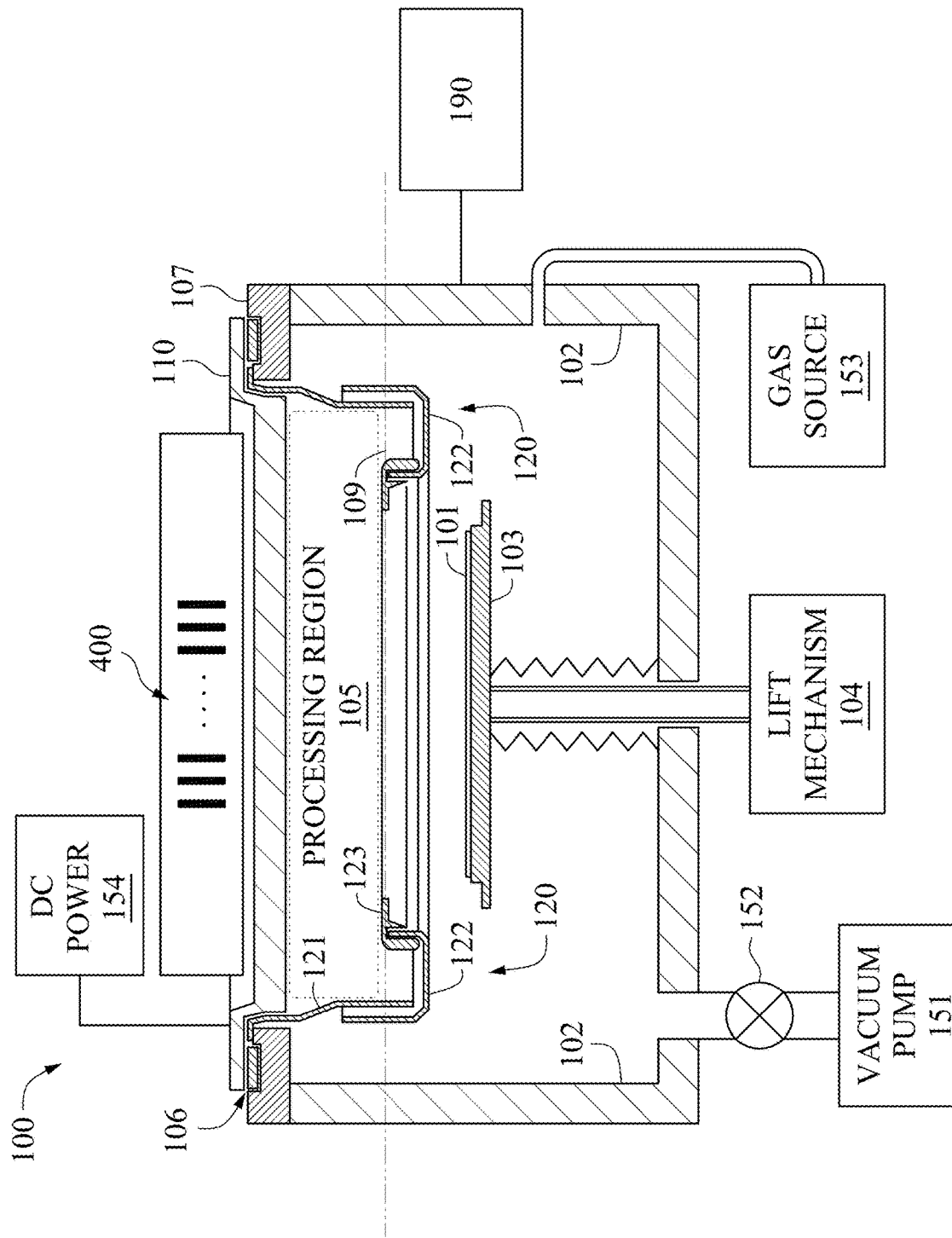
FIG. 1 illustrates a semiconductor processing chamber.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments of the disclosure generally relate to plasma processing apparatuses, such as a physical vapor deposition (PVD) process apparatus, and methods of optimizing the magnetic field generated by the physical vapor deposition (PVD) process apparatus. More particularly, embodiments of the disclosure are directed to optimizing the magnetic field generated by a magnetic assembly in the physical vapor deposition (PVD) process apparatus to deposit a more uniform film of the target material on a semiconductor substrate.

In the fabrication of semiconductor integrated circuits, metal conductor lines are used to interconnect the multiple components in device circuits on a semiconductor substrate. A general process used in the deposition of metal conductor line patterns on semiconductor substrates includes deposition of a conducting layer over the semiconductor substrate; formation of a photoresist mask or other hard masks made of an oxide, such as titanium oxide or silicon oxide, in the form of the desired metal conductor line pattern using lithographic techniques; subjecting the semiconductor substrate to a dry etching process to remove the conducting layer from the areas not covered by the mask, thereby leaving the metal layer in the form of the masked conductor line pattern; and removing the mask layer using reactive plasma, thereby exposing the top surface of the metal conductor lines. Multiple alternating layers of electrically conductive and insulative materials are sequentially deposited on the semiconductor substrate, and conductive layers at different levels over the semiconductor substrate may be electrically connected to each other by etching vias, or openings, in the insulative layers and filling the vias using aluminum, tungsten or other metal to establish electrical connection between the conductive layers.

Deposition of conductive layers over the semiconductor substrate can be carried out using physical vapor deposition (PVD). Physical vapor deposition (PVD) includes evaporation, e-beam evaporation, plasma spray deposition, and sputtering. In sputtering, a source material is physically transferred onto a semiconductor substrate in a vacuum by the deposition or "sputtering" of a metallic layer of a source material on the surface of the semiconductor substrate. The source material is present in a target which acts as a cathode in the deposition operation.

In sputtering cathodes, the source material provided in the form of a target is eroded by energetic ions from a plasma discharge and the material liberated by the ions deposits as a thin film on the substrate via physical vapor deposition (PVD). The plasma discharge is generally maintained in an evacuated process chamber, e.g., a vacuum chamber, under controlled flow of a working gas (e.g., an inert gas like argon) with an electric potential and discharge current applied by a power supply between the target cathode and an anode.

In the case of electrically conductive target materials, the target is supplied with a continuous or pulsating negative voltage, such that a plasma forms above the target surface. By means of an electrical field formed between the plasma and target surface, positively charged ions from the plasma move toward the negatively biased target surface, i.e., the cathode, bombarding the target surface and causing erosion of the target by freeing materials from the target and resulting in material being sputtered away from the target surface. The liberated material from the eroding target is directed to the semiconductor substrate or other workpiece positioned in the deposition chamber.

In sputtering systems, the plasma density above the target is strongly increased using magnetic fields. Ions in the high plasma density region produced by the magnetic field, become highly energized. The magnetic fields are produced by a magnet arranged in close proximity to the target. The magnet is disposed on the side of the target opposite the target sputtering surface, i.e. behind the target in some embodiments.

Deposition within a physical vapor deposition (PVD) process chamber is controlled through a number of variables, including chamber vacuum level, composition of process gases, plasma density and uniformity, bias applied to the wafer, etc. In addition to the above variables, the uniformity and quality of a film deposited using physical vapor deposition techniques is also dependent on the geometry of the physical vapor deposition (PVD) process chamber, such as the magnetic profile, and the shape of process kit components within the chamber, target-to-wafer spacing, and the like.

FIG. 1 is a schematic cross-sectional illustration of a physical vapor deposition (PVD) chamber 100, according to various embodiments of the present disclosure. PVD chamber 100 is configured to deposit material onto a substrate 101 as part of the process of manufacturing electronic circuits, such as integrated circuit chips and displays. More specifically, PVD chamber 100 deposits a material from sputtering target 110 onto substrate 101 by a PVD, or "sputtering," process, in which high-energy ions impact sputtering target 110, causing particles of target material to be ejected from sputtering target 110 and deposited as a film on the substrate 101. Examples of materials that can be deposited by PVD chamber 100 include, without limitation, various metals, such as aluminum (Al), copper (Cu), tungsten (W), molybdenum (Mo), tantalum (Ta), titanium (Ti), cobalt (Co), platinum (Pt), ruthenium (Rt) and an alloy thereof, and/or metal compounds, such as tantalum nitride (TaN), tungsten nitride ($W_2N$, WN, or $WN_2$), titanium nitride (TiN), aluminum nitride (AlN), scandium aluminum nitride (ScAlN or $Sc_xAl_xN$) and the like.

The PVD chamber 100 includes chamber walls 102. As shown, PVD chamber 100 further includes, disposed within chamber walls 102, a substrate support 103 coupled to a lift mechanism 104, and one or more deposition shields 120. The PVD chamber 100 further includes the sputtering target 110 mounted on or coupled to chamber walls 102. In the embodiment illustrated in FIG. 1, the sputtering target 110 is electrically separated from chamber walls 102 by an insulator 106 disposed on an adapter 107 that is mounted on the chamber walls 102. Together, sputtering target 110, deposition shields 120, and substrate support 103 (when lifted to a processing position proximate target 110) define a processing region 105 in which plasma is formed during a deposition process performed in the PVD chamber 100.

The PVD chamber 100 further includes one or more vacuum pumps 151 fluidly coupled to PVD chamber 100 via a respective valve 152, a gas source 153 fluidly coupled to PVD chamber 100, and a DC power source 154 electrically coupled to sputtering target 110. In operation, sputtering target 110 is employed as a cathode and is negatively charged, for example by being electrically coupled to the DC power source 154. The vacuum pumps 151 are configured to produce a targeted level of vacuum during a deposition process performed on semiconductor substrate 101 in the PVD chamber 100. The gas source 153 is configured to provide one or more process gases during such a deposition process. In addition, an assembly of magnets 400 is disposed outside PVD chamber 100 and proximate sputtering target 110, and is enclosed in a water-cooled chamber. The assembly of magnets 400 traps electrons over the negatively charged sputtering target 110, increasing target sputtering rates, and thus creating higher deposition rates on the substrate 101.

The DC power source 154 is electrically coupled to sputtering target 110 during the deposition process so that sputtering target 110 has a suitable charge for plasma to be generated in processing region 105. In some embodiments, substrate support 103 is also be coupled to a DC or radio frequency (RF) power source to improve uniformity or other film characteristics of material deposited on substrate 101.

In some embodiments, the DC power source 154 is configured as a programmable power supply that generates a variable DC output in response to a command, such as a command from a controller for the PVD chamber 100. The variable DC output can be implemented by the DC power source 154 via pulsed DC outputs of different power amplitude. Further, the variable DC output can follow an output profile that changes as a function of time. For example, the variable DC output can follow a profile that includes a particular power ramp-up profile during a beginning period of the PVD process and a power ramp-down profile during an ending period of the PVD process. Alternatively or additionally, the variable DC output varies with time according to any suitable function, including a step function, a sinusoidal function, or any other suitable time-varying function. In other embodiments, the DC power source 154 is configured as a controllable power supply configured to generate a particular DC output in response to a particular input value. In such embodiments, a controller associated with PVD chamber 100 transmits inputs that change in real time and thereby directly control the DC power output of the DC power source 154 during a PVD process in PVD chamber 100.

The sputtering target 110 is a solid metal or other material to be deposited, and is coupled to and supported by a backing plate. In operation, sputtering target 110 is employed as a cathode and is negatively charged in some embodiments, for example by being electrically coupled to the DC power source 154.

Deposition shields 120 protect chamber walls 102 and other components within PVD chamber 100 from receiving deposition of sputtered material. In the embodiment illustrated in FIG. 1 deposition shields 120 include an upper shield 121 mounted on adapter 107, a lower shield 122, and a cover ring 123, but PVD chamber 100 can include any other technically feasible configuration of deposition shields or a single deposition shield without exceeding the scope of the present disclosure.

The PVD chamber 100 is controlled by a system controller 190 that facilitates the control and automation of the processing chamber 100 and typically includes a central processing unit (CPU), memory, and support circuits (or I/O). The CPU may be one of any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits include cache, power supplies, clock circuits, input/output circuitry, subsystems, and the like. A program (or computer instructions) readable by the system controller 190 determines which tasks are to be performed on the substrate. The program is software readable by the system controller 190 that includes code to perform tasks relating to monitoring, execution and control of the movement and various process recipe tasks and recipe steps being performed in the PVD chamber 100. For example, the system controller 190 comprises program code that includes a substrate positioning instruction set to operate the substrate support, a gas flow control instruction set to operate flow control valves to set a flow of sputtering gas to the processing chamber 100, a gas pressure control instruction set to operate a throttle valve or gate valve to maintain a pressure in the processing chamber 100, a temperature control instruction set to control a temperature control system in the substrate support, and a process monitoring instruction set to monitor the process in the processing chamber 100.

It is challenging to produce a magnetic field that has uniform flux distribution using the magnets 400. As a result, certain areas on the surface of the target 110 facing the processing region 105 are bombarded more than other areas. This is caused by the non-uniform plasma ion distribution in the plasma in the processing region 105 which is in turn caused by the non-uniform magnetic flux distribution.

Figure 2A:
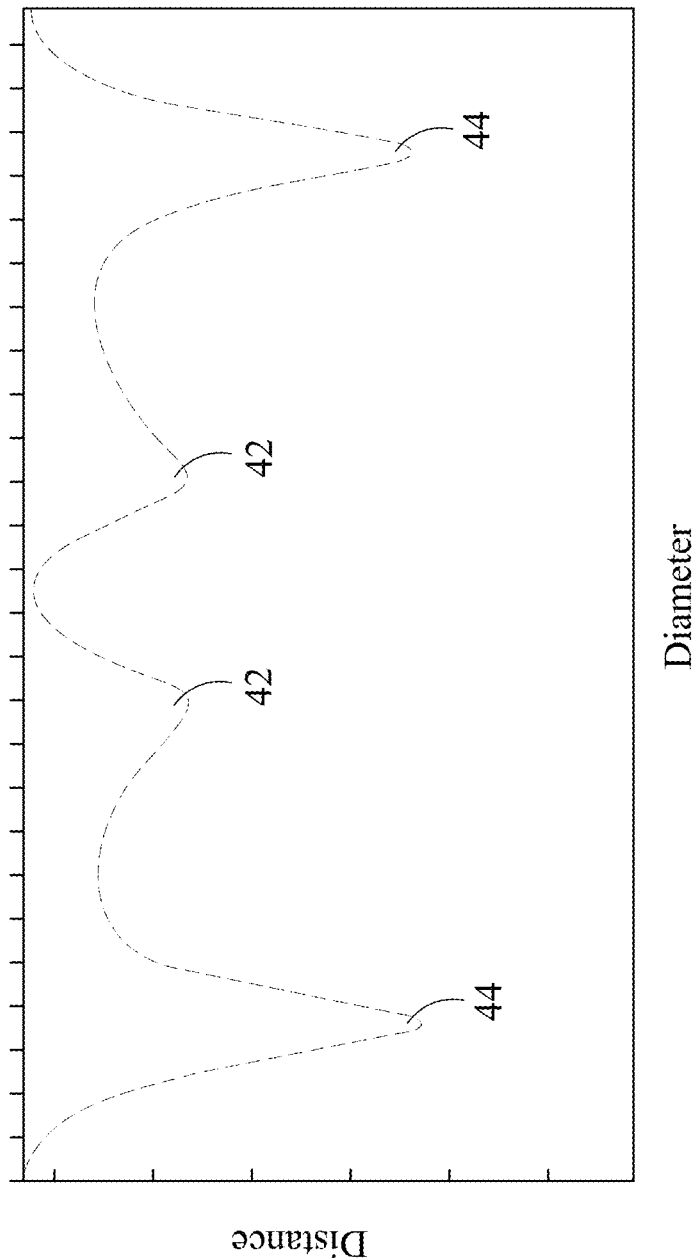
FIG. 2A is a graph illustrating an erosion profile of a titanium target surface after repeated deposition processes.

An example of an uneven target erosion wherein certain areas in the surface of a metal target 110 suffers more plasma ion bombardment resulting in more erosion for a titanium target is shown in an erosion profile in FIG. 2A. When such a non-uniform erosion profile is formed on a metal target, the target must be replaced more frequently than normally necessary in order to avoid the wearing-through of certain areas on the target by the non-uniform bombardment. As seen in FIG. 2A, the titanium target is almost worn through ⅔ of the way at an outer fringe area. 44 (shows up in a donut form when viewed from the top of the target) when compared to the center area 42 of the titanium target. A similar graph illustrating the non-uniform wear of a TiN target is shown in FIG. 2B.

Figure 2B:
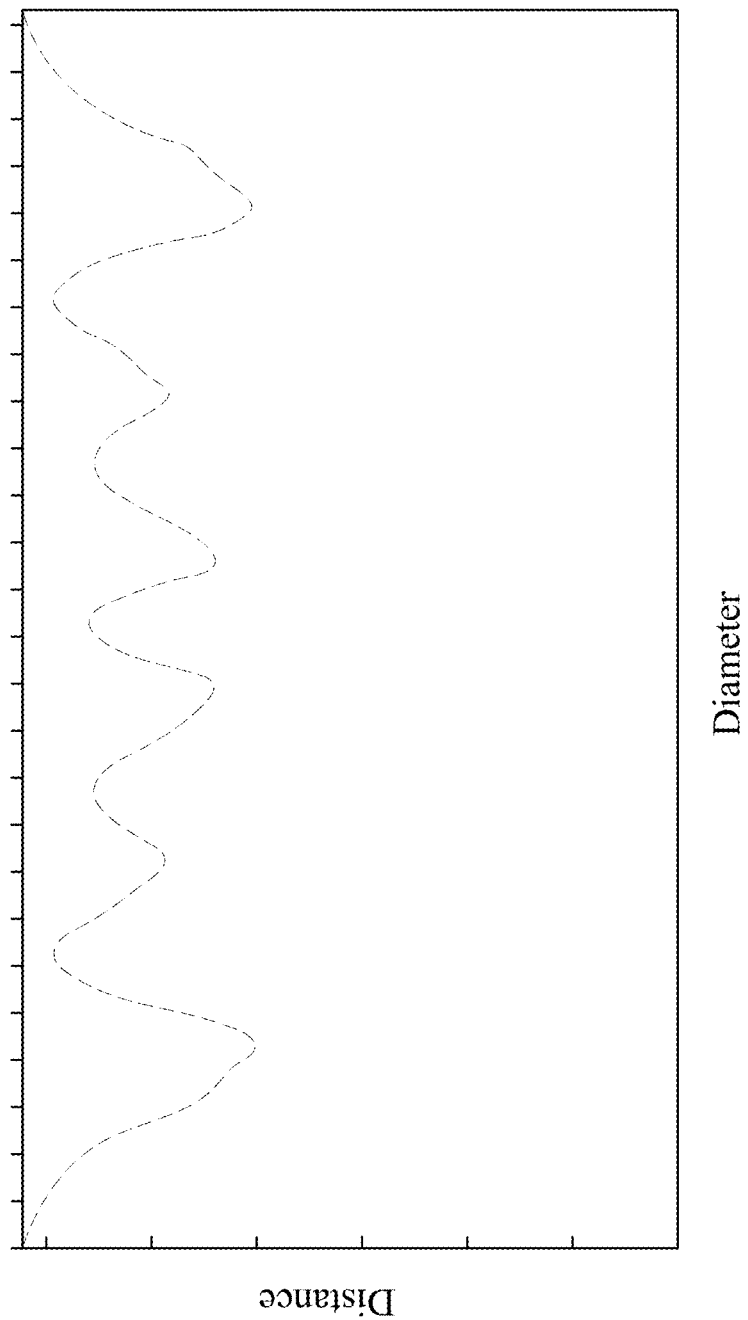
FIG. 2B is a graph illustrating an erosion profile of a titanium nitride target surface after repeated deposition processes.
Figure 3:
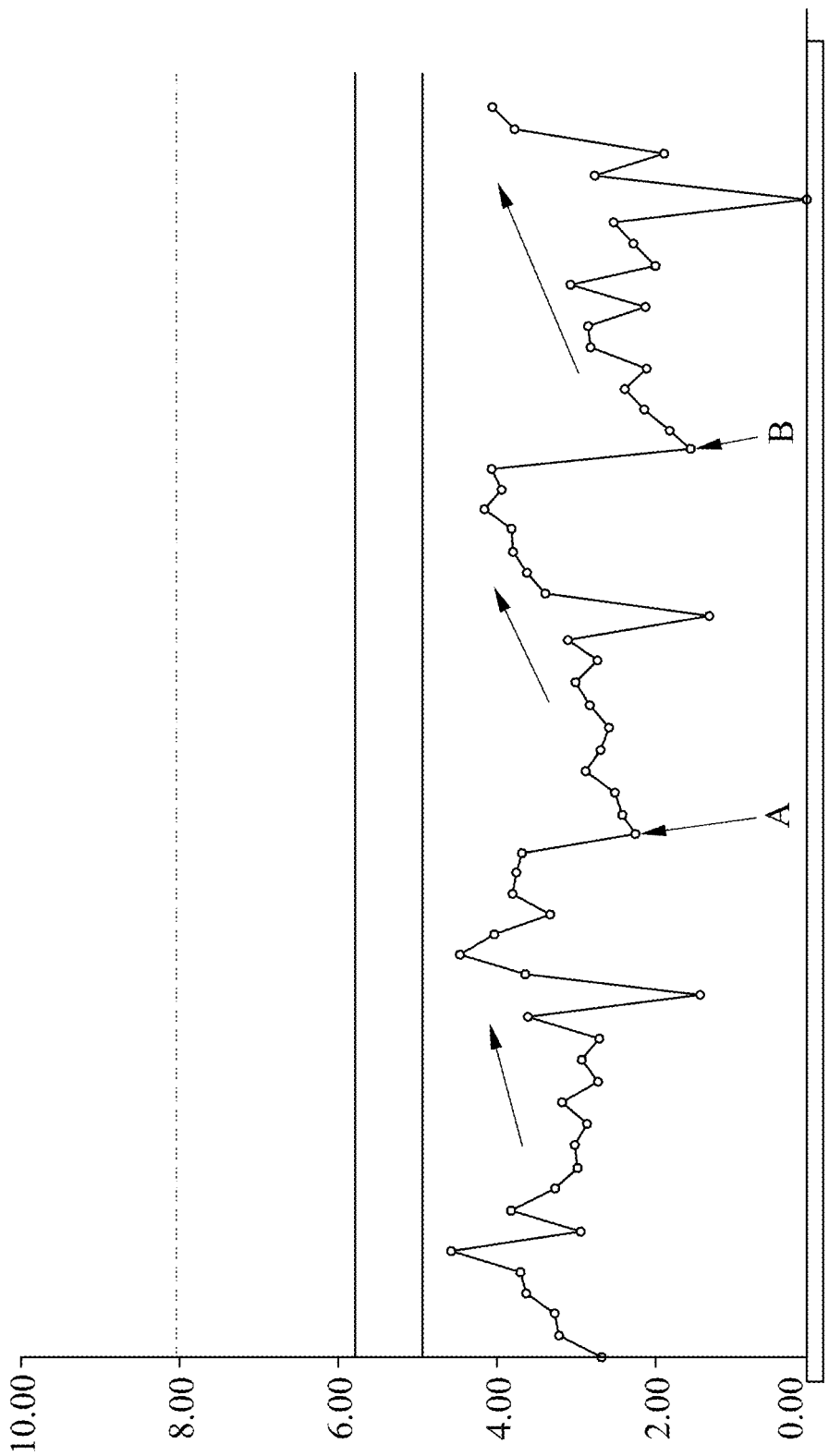
FIG. 3 is a graph illustrating the non-uniformity of the deposited film.

The non-uniform wear, or consumption of the metal target surface shown in FIGS. 2A and 2B not only causes a premature failure and a need for replacement of the metal target, but also affects the uniformity of the deposited film. This is shown in FIG. 3, a plot of non-uniformity or deviation of the film thickness against time for the sputter deposition of TiN films. At points A and B, new targets were installed to replace prematurely worn targets. As seen in FIG. 3, the non-uniformity of the deposited film gradually increases at approximately the same rate each time after the new target is installed. The data of FIG. 3 can be coordinated with the data of FIG. 2B since the more severely eroded the Ti target is (i.e., having more severely formed peaks and valleys), the more non-uniform the magnetic flux density distribution resulting in greater non-uniformity in the deposited TiN film. It is seen in FIG. 3, at the beginning of a new target, the non-uniformity of the deposited TiN film is very small. The non-uniformity gradually increases as the surface of the metal target is more severely eroded forming donut sections which are bombarded more severely by the plasma ions due to the non-uniform magnetic flux distribution. The non-uniform magnetic flux distribution, as previously discussed, is caused by a cathode that has magnets mounted on top in fixed positions.

Embodiments of the disclosure are directed to a magnetic assembly for sputter deposition that includes an arrangement of magnets that is capable of producing a substantially uniform magnetic flux distribution. The substantially uniform magnetic flux distribution results in sputter depositing a more uniform thickness metal film on a semiconductor substrate. A uniform metal film exhibits a more uniform resistivity throughout the area of the film.

Although embodiments of the disclosure are discussed with reference to the magnetic assembly 400, embodiments are not limited thereto. Embodiments of the disclosure are equally applicable to other types of magnetic field generators used in processing chambers wherein it is desirable to obtain a more uniform magnetic field, without departing from the scope of the disclosure.

Figure 4A:
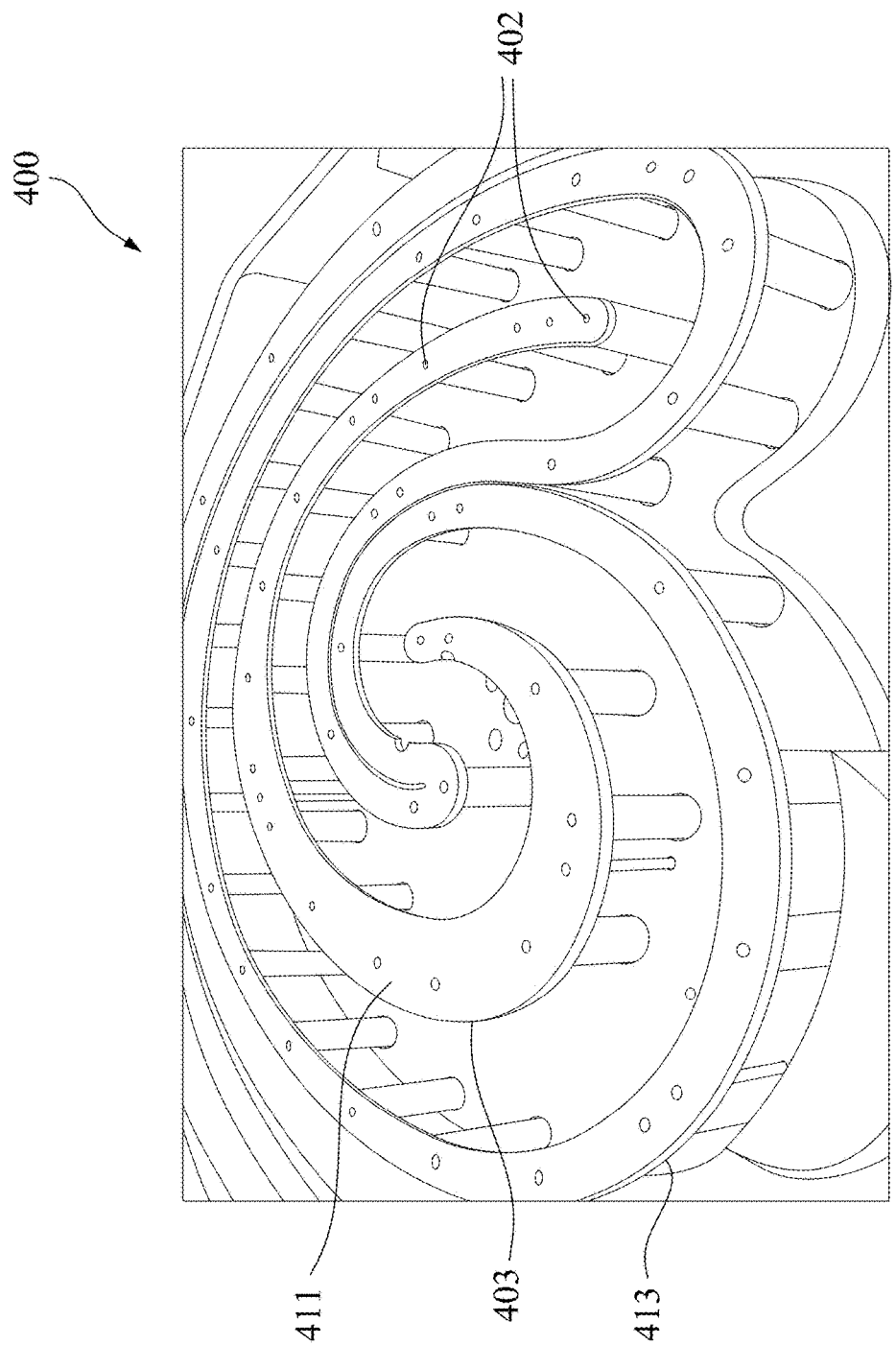
FIG. 4A illustrates a partial isometric view of an assembly in FIG. 1 including a plurality of magnets.
Figure 4B:
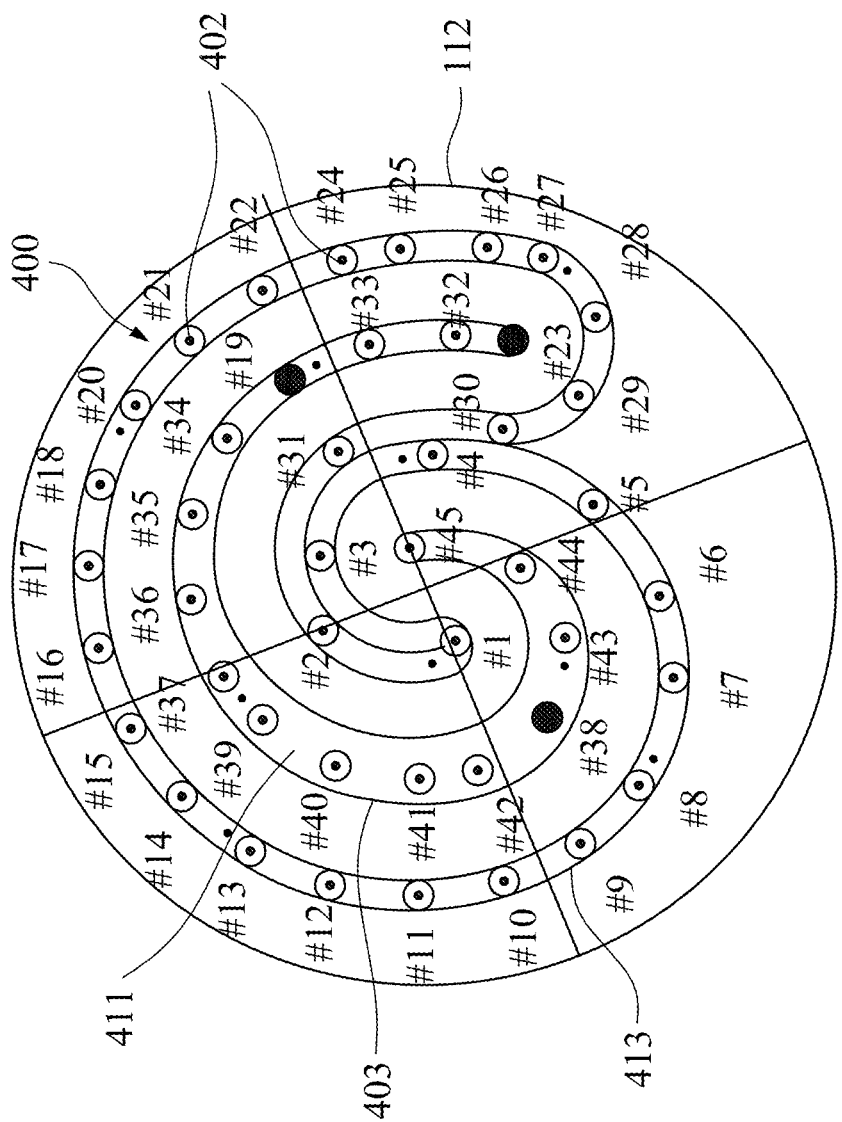
FIG. 4B illustrates a plan view of the assembly in FIG. 4A.

FIG. 4A illustrates a partial isometric view of an assembly 400 in FIG. 1 including a plurality of magnets 402. FIG. 4B illustrates a plan view of the assembly 400 in FIG. 4A. Referring to FIGS. 4A and 4B, each magnet 402 has a shape of a column (or pillar) and the plurality of magnetic columns 402 are arranged in a desired arrangement. The magnetic columns 402 include permanent magnets made of rare earth, high strength materials, in some embodiments. The plurality of magnetic columns 402 are arranged in a substantially upright position with reference to the horizontal (FIG. 1). A supporting structure 403 secures the plurality of magnetic columns 402 in their positions. In some embodiments, and as illustrated, the plurality of magnetic columns 402 includes 45 magnetic columns. Each magnet magnetic column 402 is arranged at a specific position and is specifically numbered.

In some embodiments, and as illustrated, the plurality of magnetic columns 402 are arranged in two or more groups of magnetic columns 402 via different supporting structures 403. The magnetic assembly includes groups 411 and 413 of magnetic columns 402. Although each group 411 and 413 is illustrated as including multiple magnetic columns 402, in some embodiments, one or more groups can include a single magnetic column 402. Each group 411 and 413 is formed by magnetic columns 402 secured in position by a corresponding supporting structure 403. As discussed below, each group 411 and 413 can have different values of magnetic flux density. In some embodiments, the plurality of magnetic columns 402 are arranged in a matrix type arrangement including a desired number of rows and columns. In other embodiments, and as illustrated, the plurality of magnetic columns 402 are arranged in a spiral arrangement. In some embodiments, the north (N) pole and the south (S) pole of adjacent magnetic columns 402 are alternately arranged.

Figure 5:
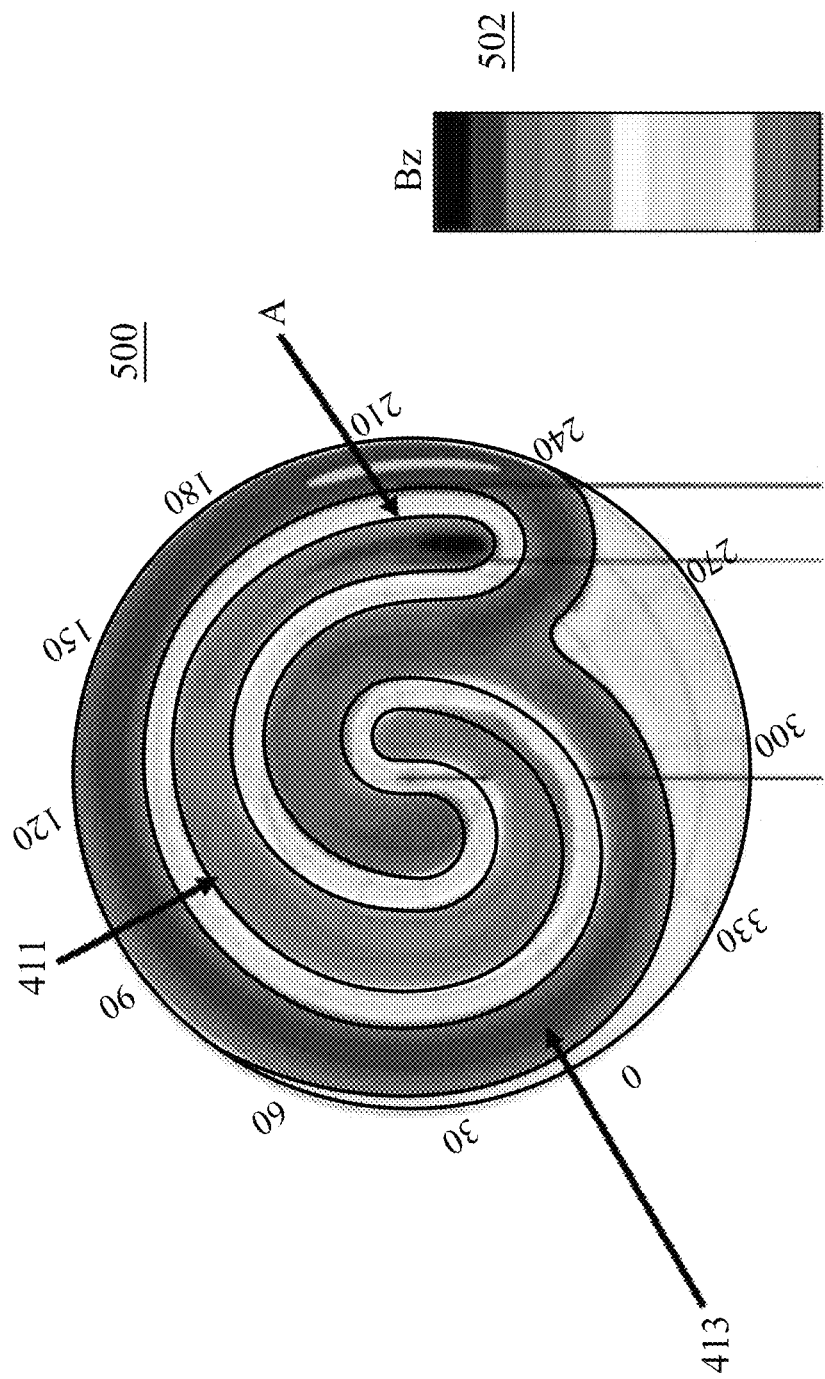
FIG. 5 illustrates a magnetic flux density distribution map of the magnetic assembly in FIGS. 4A and 4B.

FIG. 5 illustrates a magnetic flux density distribution map 500 of the magnetic assembly 400 in FIGS. 4A and 4B. Also illustrated in FIG. 5 is a scale 502 indicating different shading for different values of the magnetic flux density of the magnetic assembly 400. The scale 502 depicts increasing values of the magnetic flux density from the bottom of the scale to the top, wherein the top most value on the scale is the largest and the bottommost value is the lowest.

Referring to FIGS. 4A, 4B, and 5, the group 411 has a substantially first value of magnetic flux density and the group 413 has a substantially second value of magnetic flux density.

Referring to the scale 502, it is observed that the magnetic flux density is the greatest in the area A in group 411 compared to the magnetic flux density values in the remaining group 411 and group 413. This relatively uneven distribution of the magnetic flux density causes a larger variation in the magnetic field, as a result of which a non-uniform film of the target metal is deposited on the semiconductor substrate. It is desirable to reduce the magnetic flux density in the area A to obtain a more uniform magnetic flux density distribution.

A more uniform magnetic flux density distribution within one or more groups of the magnetic columns can be obtained by adjusting the magnetic field generated by the plurality of magnetic columns 402. In some embodiments, the magnetic field can be adjusted by changing a position of one or more magnetic columns, and thereby obtain a more uniform magnetic flux density distribution. For instance, one or more magnetic columns are moved (raised) away from the processing region 105 to reduce the magnetic field generated by the magnetic assembly 400. In other embodiments, the magnetic field can be adjusted by removing one or more magnetic column from the magnetic assembly, and thereby obtain a more uniform magnetic flux density distribution. In some embodiments, magnetic columns 19, 23, and 38 are moved to obtain a more uniform magnetic flux density distribution. In some embodiments, magnetic columns numbered 19, 23, and 38 are removed to obtain a more uniform magnetic flux density distribution. In some embodiments, the magnetic columns are removed such that a separation (gap) between two adjacent (immediately adjacent) magnetic columns 402 is greater than a separation between more than at least 80% of magnets in the magnetic assembly 400. In other embodiments, the separation is more than at least 90% of magnets in the magnetic assembly 400. In other embodiments, magnetic columns other than magnetic columns numbered 19, 23, and 38 are moved or removed to obtain a more uniform magnetic flux density distribution. It should be noted that the magnetic columns to be removed or raised is dependent on the arrangement (configuration) of the plurality of the magnetic columns 402 in the assembly 400 and the magnetic flux density distribution obtained using that arrangement. Thus, in a different arrangement of magnetic columns, different magnetic columns are removed to obtain a more uniform magnetic flux density distribution.

In some embodiments, in order to determine the uniformity of the magnetic flux density distribution, a test operation (or similar) is performed, wherein the semiconductor processing operation is stopped and the magnetic flux density distribution of the assembly 400 is measured and variation in the magnetic flux density distribution is determined.

The uniformity of the metal film deposited is different for different portions of the semiconductor device where the metal film is formed. For example, some regions (e.g., gate) of the semiconductor substrate have a relatively thicker film than other regions of the semiconductor substrate. In other examples, some metal interconnects between individual devices (e.g., transistors) may be thicker than other metal interconnects. Thus, the uniformity of the metal film is determined individually for different regions of the semiconductor substrate. As such, depending on the devices fabricated on the semiconductor substrate, the metal film will be non-uniform over the entire semiconductor substrate, but may be uniform in a specific regions of the semiconductor substrate.

Figure 6:
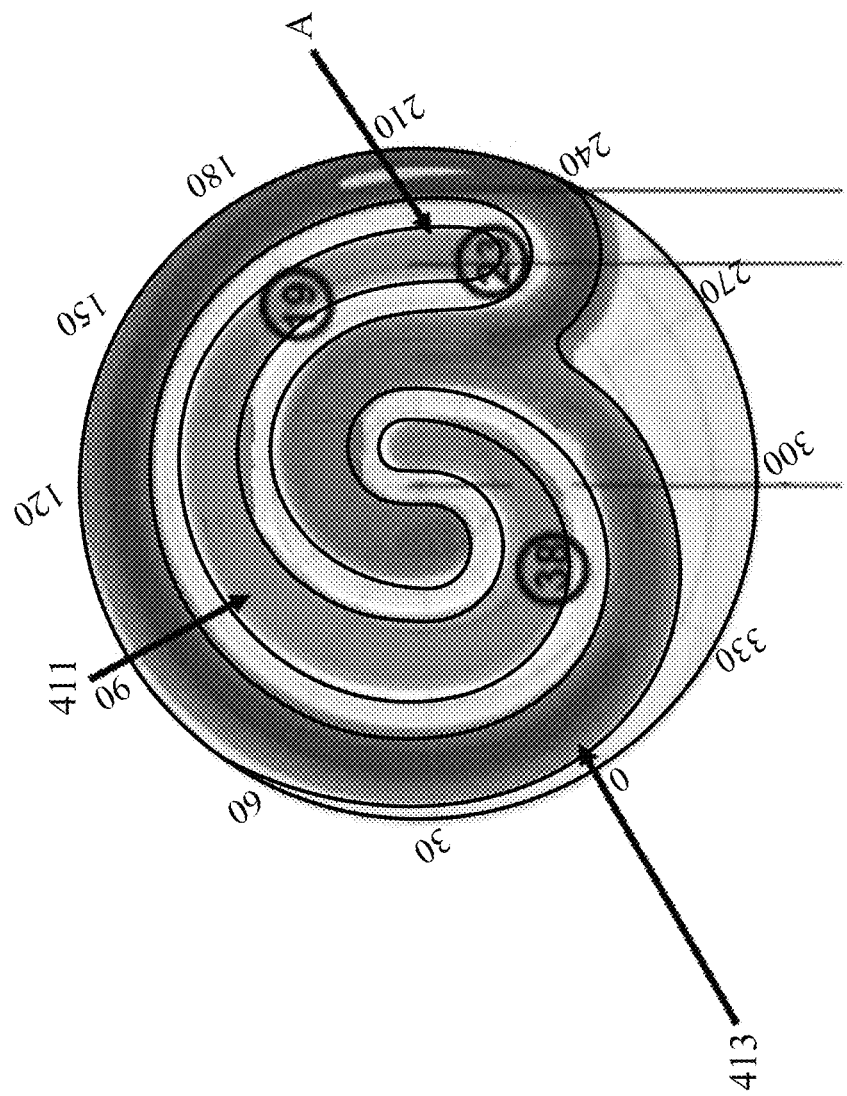
FIG. 6 illustrates a magnetic flux density distribution map of the magnetic assembly in FIGS. 4A and 4B obtained after magnetic columns 19, 23, and 38 are removed, according to embodiments of the disclosure.

FIG. 6 illustrates a magnetic flux density distribution map 600 of the magnetic assembly 400 in FIGS. 4A and 4B obtained after magnetic columns 19, 23, and 38 are removed, according to embodiments of the disclosure. As illustrated, due to the removal of the magnetic columns 19, 23, and 38, the magnetic flux density in the area A is reduced and a more uniform magnetic flux density distribution is obtained in the group 411 from the magnetic assembly 400.

Because of the more uniform magnetic flux density distribution in groups 411 and 413, a more uniform metal film is deposited on the semiconductor substrate. A uniform metal film exhibits a more uniform resistivity throughout the area of the film. In addition, the target material is eroded more uniformly. For the purposes of discussion herein, it should be noted that a uniform magnetic flux distribution may indicate that the entire magnetic flux distribution of the magnetic assembly 400 has a substantially same value (within an acceptable variation). Alternatively, a uniform magnetic flux distribution may indicate that a group of the magnetic columns 402 of the magnetic assembly 400 exhibit a magnetic flux distribution having a substantially first value and another group of magnetic columns 402 (different from the first) of the magnetic assembly 400 exhibit a magnetic flux distribution having a substantially second value. In this instance, while the magnetic flux distribution of the different groups is different, the magnetic flux distribution within each group is substantially the same. This is unlike the scenario illustrated in FIG. 5, wherein the magnetic flux distribution of the magnetic columns 402 in group 411 includes an area A having a substantially higher value of the magnetic flux distribution than the remaining portion of group 411.

In some embodiments, the thickness of the film deposited on the semiconductor substrate during the manufacturing of a semiconductor device is monitored, e.g., at desired intervals. In some embodiments, a test operation (or similar) is performed at desired intervals during which the semiconductor processing operation (e.g., PVD operation) is halted to measure the magnetic flux density distribution of the assembly 400, the variation in the magnetic flux density distribution, and the thickness of the deposited film. Additionally or alternatively, the erosion of the target material is also monitored. As discussed below, in some embodiments, the thickness of the film can be determined based on the resistivity of the deposited film. When the differences in the thickness of the deposited film in different areas of the deposited film is greater than a threshold value, the magnetic field generated by the magnetic assembly 400 is optimized, according to embodiments disclosed herein, to be more uniform. Additionally or alternatively, when difference in the thickness of the target material in different locations of the target material exceeds a threshold, indicating an undesirable non-uniform erosion of the target material, the magnetic field generated by the magnetic assembly 400 is optimized, according to embodiments disclosed herein, to be more uniform such that the target material is eroded more uniformly and a more uniform film is deposited on the semiconductor substrate.

In addition to removing the magnetic columns 402, the spacing between the semiconductor substrate 101 (FIG. 1) and the sputtering target 110 (FIG. 1) is also varied to deposit a more uniform metal film on the semiconductor substrate 101. In some embodiments, the spacing is decreased. In some embodiments, the spacing is decreased from about 60 mm to about 53 mm. In some other embodiments, the spacing is decreased from about 60 mm to about 55 mm. In some embodiments, the spacing is less than 53 mm after decreasing the spacing.

Figure 7:
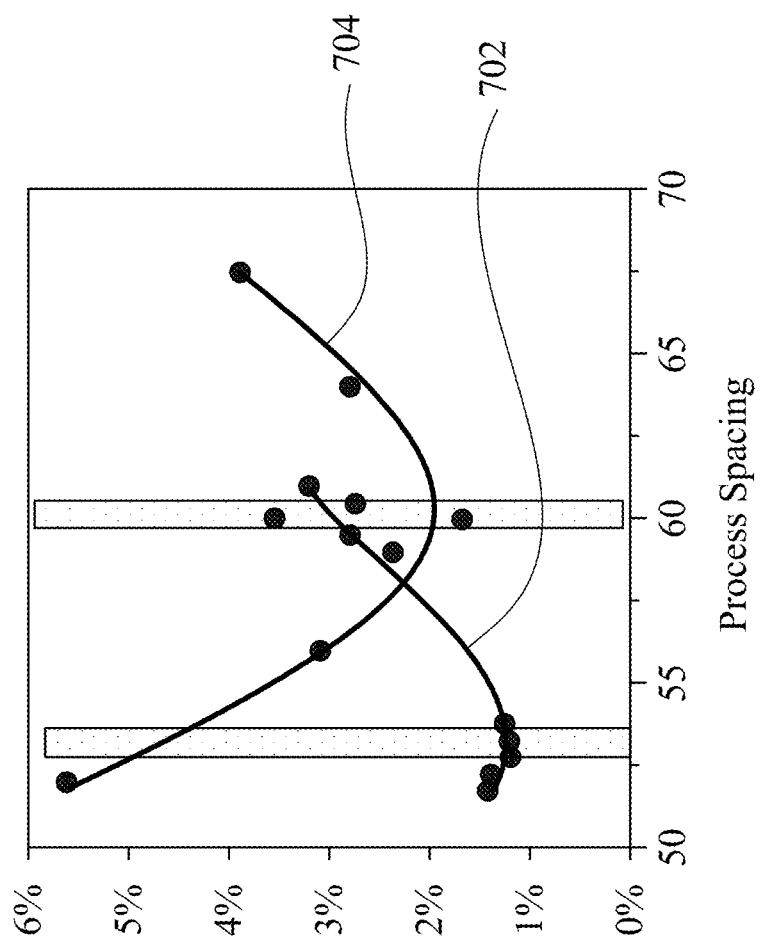
FIG. 7 is a graph depicting a variation in the resistivity of the deposited film on the semiconductor substrate with variation in the target-to-substrate spacing.

FIG. 7 is a graph depicting a variation in the resistivity uniformity of the deposited film on the semiconductor substrate with variation in the target-to-substrate spacing. The resistivity uniformity is plotted along the ordinate as a percentage (%) standard deviation in the resistivity over the semiconductor substrate and the target-to-substrate spacing is plotted along the abscissa. The plot 702 indicates the variation in the resistivity of the deposited film with variation in the target-to-substrate spacing when the magnetic columns 19, 23, and 38 are retained in the magnetic assembly 400 (FIGS. 4A and 4B) and the target-to-substrate spacing is substantially around 60 mm (with some acceptable variation). The plot 704 indicates the variation in the resistivity of the deposited film with variation in the target-to-substrate spacing when the magnetic columns 19, 23, and 38 are removed from the magnetic assembly 400 (FIGS. 4A and 4B) and the target-to-substrate spacing is substantially around 53 mm (with some acceptable variation). As is seen, the variation in the resistivity of the deposited film is the lowest when the target-to-substrate spacing is substantially around 53 mm and magnetic columns 19, 23, and 38 are absent. The low value of the resistivity indicates that a film having a more uniform thickness has been deposited on the semiconductor substrate. In some embodiments, the film includes titanium nitride (TiN) and has a resistivity uniformity of around 1% and a resistivity of less than about 10 $\mu\Omega$-cm. In some embodiments, the resistivity is measured using a four point probe.

Figure 8A:
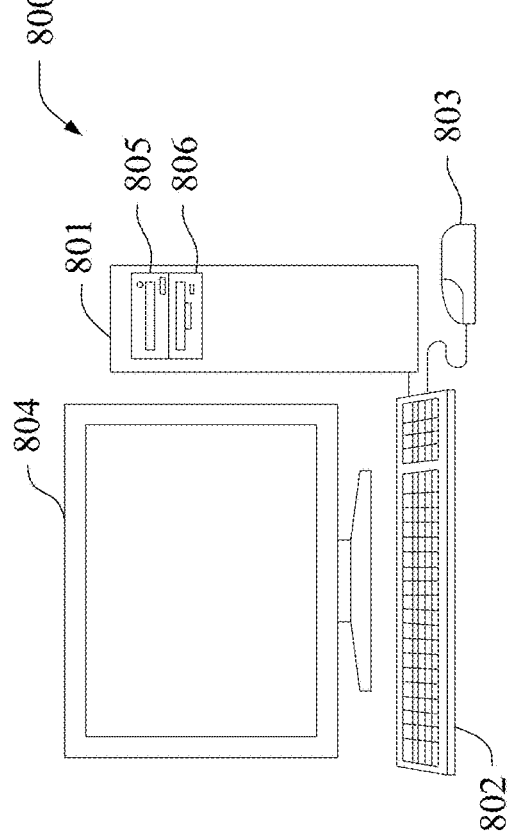
FIGS. 8A and 8B show a controller according to embodiments of the disclosure.

FIG. 8A is a schematic view of a computer system that operates as a controller (e.g., controller 190) for determining thickness of the target film deposited on the semiconductor substrate, determining erosion of the target material, operating the semiconductor processing chamber 100, and performing other tasks mentioned in the disclosure. The foregoing embodiments may be realized using computer hardware and computer programs executed thereon. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a display 804.

Figure 8B:
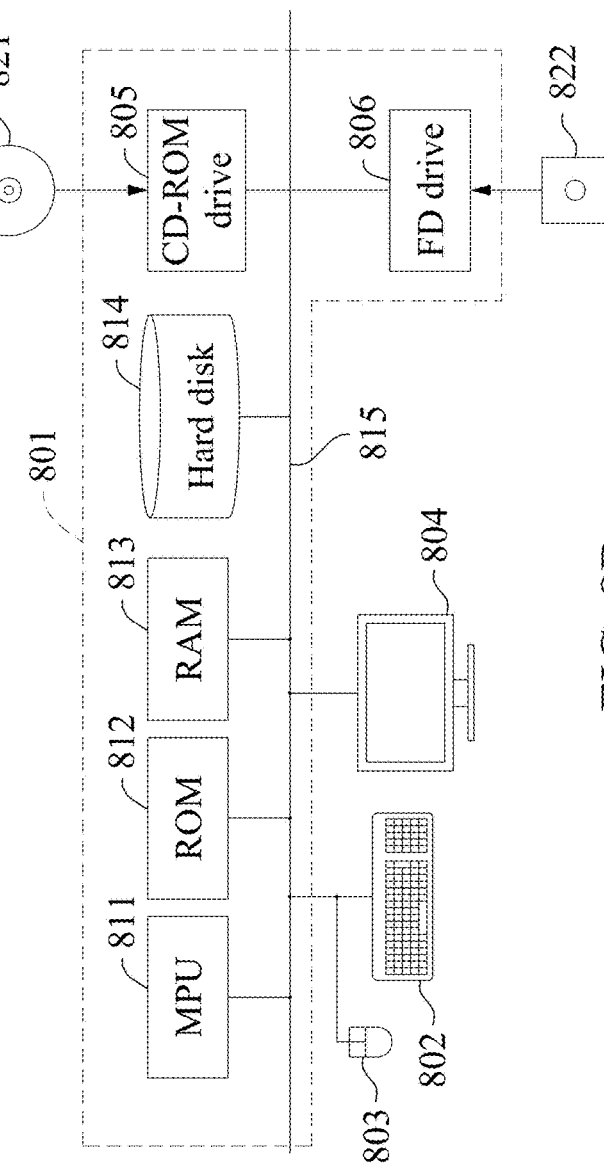

FIG. 8B is a diagram showing an internal configuration of the computer system 800. In FIG. 8B, the computer 801 is provided with, in addition to the optical disk drive 805 and the magnetic disk drive 806, one or more processors 811, such as a micro processing unit (MPU), a ROM 812 in which a program such as a boot up program is stored, a random access memory (RAM) 813 that is connected to the MPU 811 and in which a command of an application program is temporarily stored and a temporary storage area is provided, a hard disk 814 in which an application program, a system program, and data are stored, and a bus 815 that connects the MPU 811, the ROM 812, and the like. Note that the computer 801 may include a network card (not shown) for providing a connection to a LAN.

The program code for causing the computer system 800 to execute the operations/tasks discussed in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network.

Figure 9:
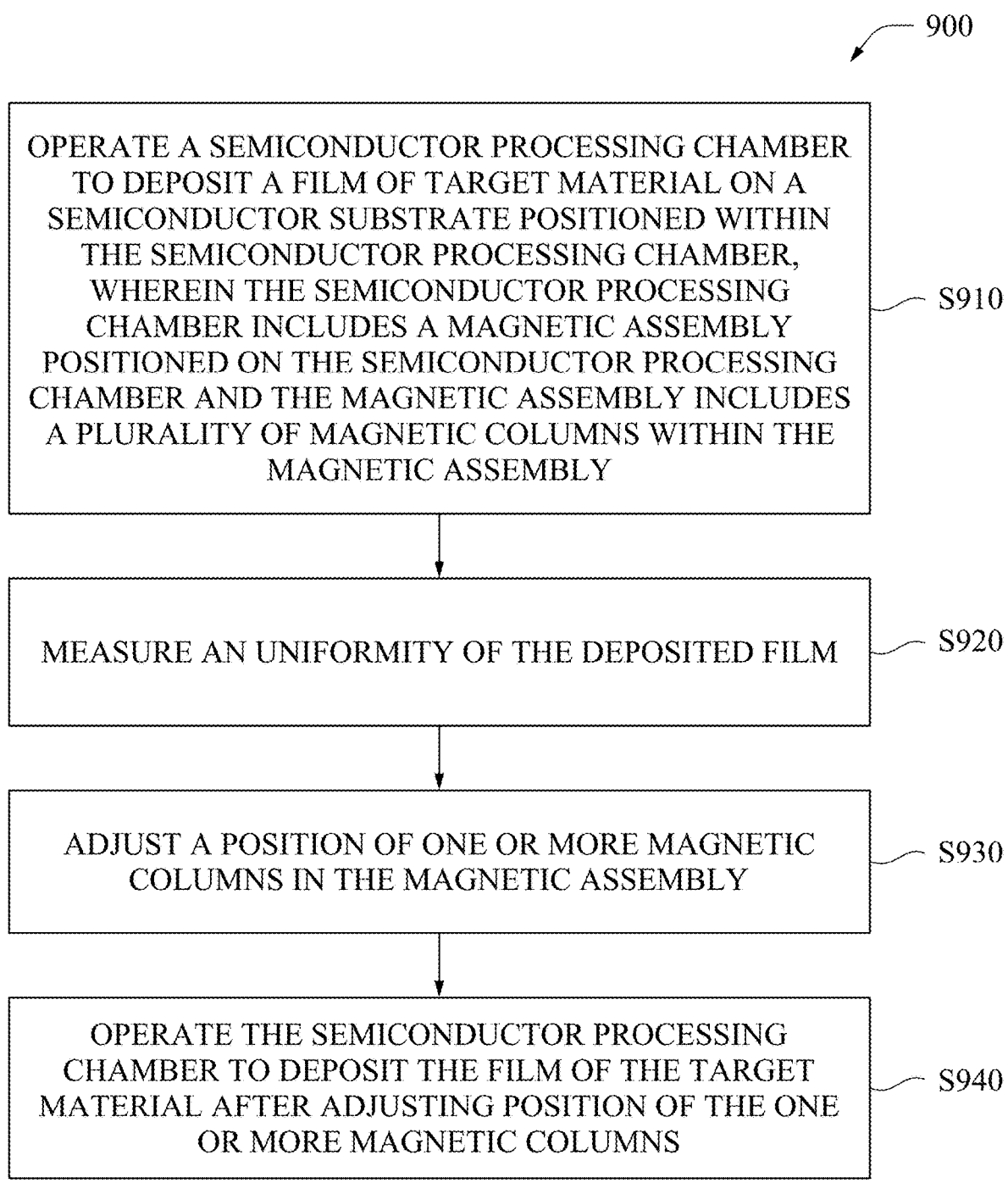
FIG. 9 is a flowchart of a method of optimizing a thickness of a target material film deposited in a semiconductor substrate in a semiconductor processing chamber, according to embodiments of the disclosure.

An embodiment of the present disclosure is a method 900 of optimizing a thickness of a target material film deposited in a semiconductor substrate in a semiconductor processing chamber according to the flowchart illustrated in FIG. 9. It is understood that additional operations can be provided before, during, and after processes discussed in FIG. 9, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S910 of operating the semiconductor processing chamber to deposit a film of target material on a semiconductor substrate positioned within the semiconductor processing chamber. The semiconductor processing chamber includes a magnetic assembly positioned on the semiconductor processing chamber, and the magnetic assembly includes a plurality of magnetic columns within the magnetic assembly. In operation S920, a uniformity of the deposited film is measured. In operation S930, a position of one or more magnetic columns in the magnetic assembly is adjusted. In operation S940, the semiconductor processing chamber is operated to deposit the film of the target material after adjusting position of the one or more magnetic columns.

Figure 10:
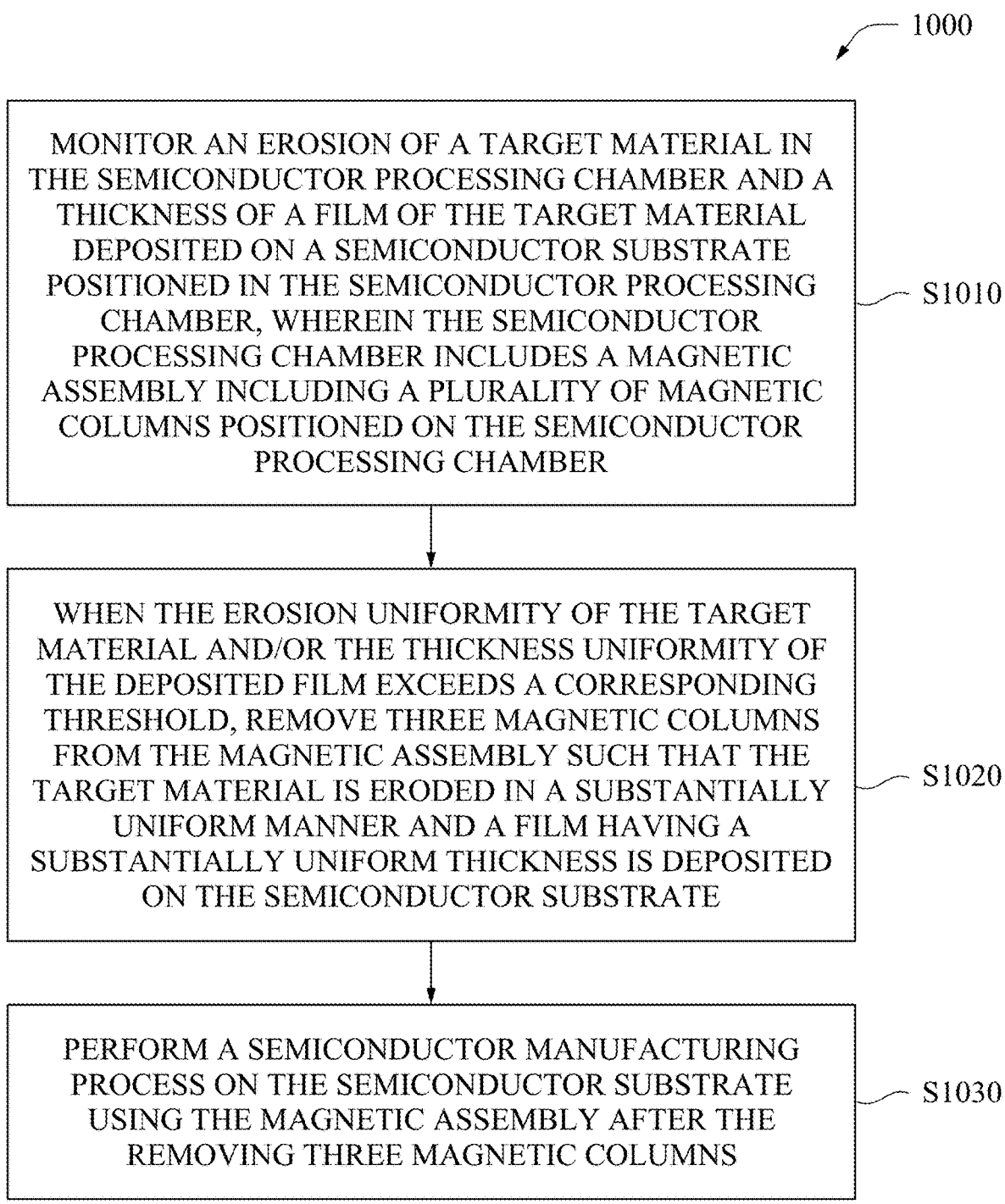
FIG. 10 is a flowchart of a method of using a semiconductor processing chamber, according to embodiments of the disclosure.

An embodiment of the present disclosure is a method 1000 of using a semiconductor processing chamber according to the flowchart illustrated in FIG. 10. It is understood that additional operations can be provided before, during, and after processes discussed in FIG. 10, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1010 of monitoring an erosion of a target material in the semiconductor processing chamber and a thickness of a film of the target material deposited on a semiconductor substrate positioned in the semiconductor processing chamber. The semiconductor processing chamber includes a magnetic assembly including a plurality of magnetic columns positioned on the semiconductor processing chamber. In operation S1020, when the erosion uniformity of the target material and/or the thickness uniformity of the deposited film exceeds a corresponding threshold, three magnetic columns are removed from the magnetic assembly such that the target material is eroded in a substantially uniform manner and a film having a substantially uniform thickness is deposited on the semiconductor substrate. In operation S1030, a semiconductor manufacturing process is performed on the semiconductor substrate using the magnetic assembly after the removing three magnetic columns.

Figure 11:
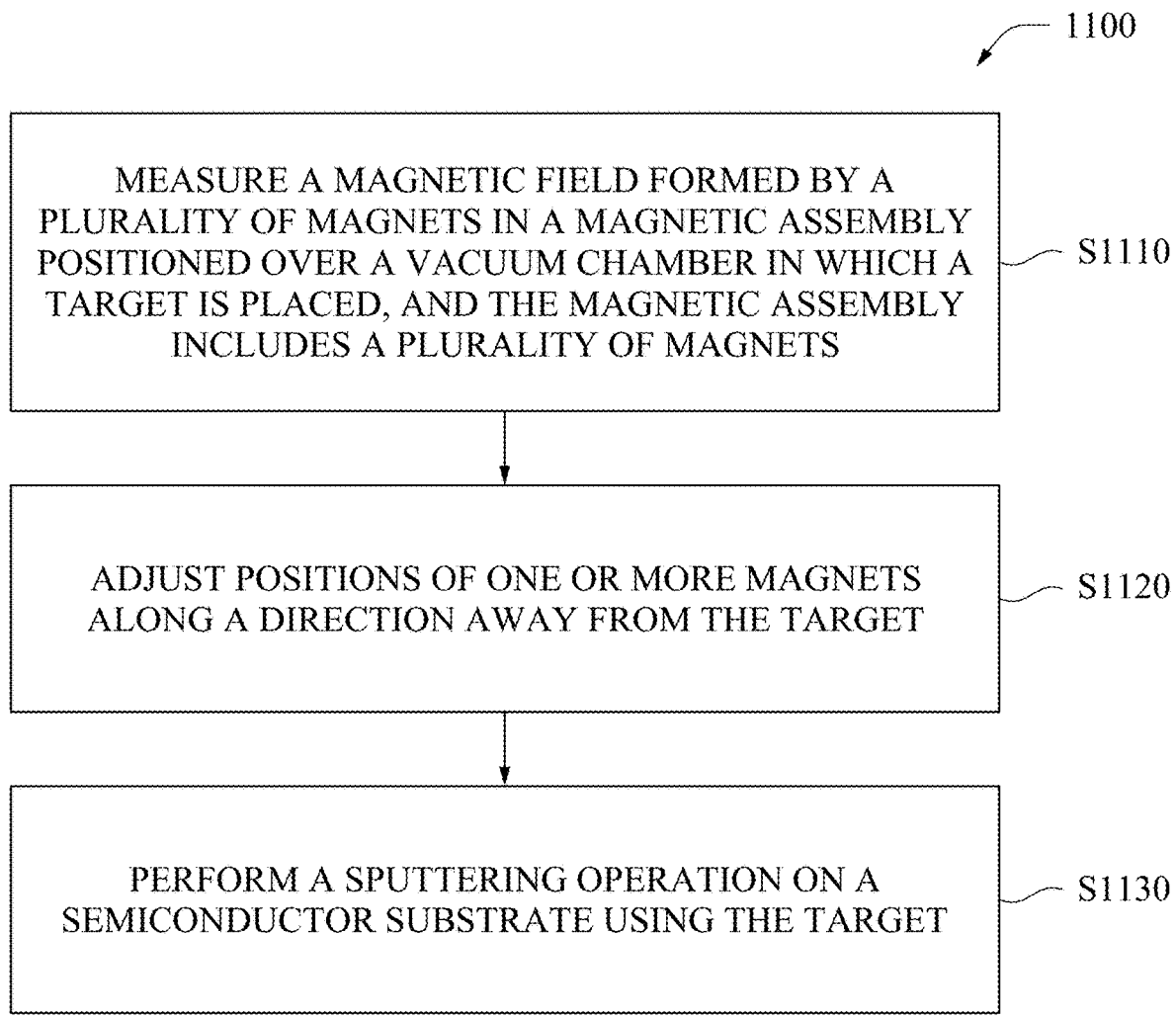
FIG. 11 is a flowchart of a method of operating a semiconductor processing chamber, according to embodiments of the disclosure.

An embodiment of the present disclosure is a method 1100 of operating a semiconductor processing chamber according to the flowchart illustrated in FIG. 11. It is understood that additional operations can be provided before, during, and after processes discussed in FIG. 11, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1110 of measuring a magnetic field formed by a plurality of magnets in a magnetic assembly positioned over a vacuum chamber in which a target is placed, and the magnetic assembly includes a plurality of magnets. In operation S1120, positions of one or more magnets are adjusted along a direction away from the target. In operation S1130, a sputtering operation is performed on a semiconductor substrate using the target.

Embodiments of the disclosure provide an advantageous method of improving the thickness of the target film deposited on the semiconductor substrate using a PVD chamber. The method also ensures that the target material is eroded more evenly.

It will be understood that not all advantages have been necessarily discussed herein, no particular advantage is required for all embodiments or examples, and other embodiments or examples may offer different advantages.

Embodiments of the present disclosure are directed to a method for optimizing thickness of a target material film deposited on a semiconductor substrate in a semiconductor processing chamber. The semiconductor processing chamber includes a magnetic assembly positioned on the semiconductor processing chamber and the magnetic assembly includes a plurality of magnetic columns within the magnetic assembly. The method includes operating the semiconductor processing chamber to deposit a film of target material on a semiconductor substrate positioned within the semiconductor processing chamber, measuring an uniformity of the deposited film, adjusting a position of one or more magnetic columns in the magnetic assembly, and operating the semiconductor processing chamber to deposit the film of the target material after adjusting position of the one or more magnetic columns. In some embodiments, an operation of the semiconductor processing chamber is stopped, and the one or more magnetic columns are removed from the magnetic assembly. In some embodiments, an operation of the semiconductor processing chamber is stopped, and one or more magnetic columns of the magnetic assembly are moved along a direction away from a target material arranged in the semiconductor processing chamber. In some embodiments, the uniformity of the deposited film is measured by measuring a resistivity of the deposited film at different regions of the semiconductor substrate to determine a thickness of the film deposited in each of the different regions of the semiconductor substrate. In some embodiments, a spacing between the target material and the semiconductor substrate is decreased, and the semiconductor processing chamber is operated to deposit the film of the target material after decreasing the spacing and after removing two or more magnetic columns from the magnetic assembly. In some embodiments, the spacing is decreased to around 53 mm from around 60 mm. In some embodiments, the film of target material includes titanium nitride (TiN) having a resistivity variation of 1% and a resistivity of less than 10 $\mu\Omega$-cm. In some embodiments, the plurality of magnetic columns include permanent magnetic material. In some embodiments, the film of target material includes a material selected from the group consisting of aluminum (Al), copper (Cu), tungsten (W), molybdenum (Mo), tantalum (Ta), titanium (Ti), tantalum nitride (TaN), tungsten nitride ($W_2N$, WN, or $WN_2$), titanium nitride (TiN), aluminum nitride (AlN), and scandium aluminum nitride (ScAlN or $Sc_xAl_xN$).

Embodiments of the present disclosure are directed to a method of manufacturing a semiconductor device using a semiconductor processing chamber. The semiconductor processing chamber includes a magnetic assembly including a plurality of magnetic columns positioned on the semiconductor processing chamber. The method includes monitoring an erosion of a target material in the semiconductor processing chamber and a thickness of a film of the target material deposited on a semiconductor substrate positioned in the semiconductor processing chamber, when the erosion uniformity of the target material and/or the thickness uniformity of the deposited film exceeds a corresponding threshold, removing three magnetic columns from the magnetic assembly such that the target material is eroded in a substantially uniform manner and a film having a substantially uniform thickness is deposited on the semiconductor substrate, and performing a semiconductor manufacturing process on the semiconductor substrate using the magnetic assembly after the removing three magnetic columns. In some embodiments, a spacing between the target material and the semiconductor substrate is decreased, and the semiconductor manufacturing process is performed to deposit the film of the target material after decreasing the spacing. In some embodiments, the spacing is decreased to around 53 mm from around 60 mm. In some embodiments, the film of target material includes titanium nitride (TiN) having a resistivity variation of 1% and a resistivity of less than 10 $\mu\Omega$-cm. In some embodiments, the semiconductor manufacturing operation includes a deposition operation or an etching operation. In some embodiments, the plurality of magnets include permanent magnets. In some embodiments, three magnetic columns are removed such that a magnetic flux density due to the plurality of magnets is substantially uniform. In some embodiments, wherein the plurality of magnetic columns are arranged in two or more groups, and magnetic columns from one or more groups are removed.

According to some embodiments of the present disclosure, a method includes measuring a magnetic field formed by a plurality of magnets in a magnetic assembly positioned over a vacuum chamber in which a target is placed, and the magnetic assembly includes a plurality of magnets, adjusting positions of one or more magnets along a direction away from the target, and performing a sputtering operation on a semiconductor substrate using the target. In some embodiments, the positions of the one or more magnets are adjusted based on a thickness of a film of the target deposited on the semiconductor substrate. In some embodiments, the positions of the one or more magnets are adjusted such that a substantially uniform magnetic field is generated.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of optimizing thickness of a target material film deposited on a semiconductor substrate in a semiconductor processing chamber, wherein the semiconductor processing chamber includes a magnetic assembly positioned on the semiconductor processing chamber, the magnetic assembly including a plurality of magnetic columns within the magnetic assembly, the method comprising:
   operating the semiconductor processing chamber to deposit the target material film on the semiconductor substrate positioned within the semiconductor processing chamber;
   measuring a uniformity of the deposited target material film by measuring a resistivity of the deposited target material film at different regions of the semiconductor substrate to determine a thickness of the deposited target material film in each of the different regions of the semiconductor substrate;
   based on the measured uniformity of the deposited target material film, adjusting a position of one or more magnetic columns of the plurality of magnetic columns relative to a position of another magnetic column of the plurality of magnetic columns in the magnetic assembly; and
   operating the semiconductor processing chamber to further deposit the target material film after adjusting the position of the one or more magnetic columns.

2. The method of claim 1, wherein adjusting the position includes stopping an operation of the semiconductor processing chamber, and
   removing the one or more magnetic columns from the magnetic assembly.

3. The method of claim 1, wherein adjusting the position includes stopping an operation of the semiconductor processing chamber, and
   moving the one or more magnetic columns of the magnetic assembly along a direction away from a target material arranged in the semiconductor processing chamber.

4. The method of claim 1, further comprising:
   decreasing a spacing between a target material in the semiconductor processing chamber and the semiconductor substrate; and
   operating the semiconductor processing chamber to deposit the target material film after decreasing the spacing and after removing two or more magnetic columns of the plurality of magnetic columns from the magnetic assembly.

5. The method of claim 4, wherein the spacing is decreased to around 53 mm from around 60 mm.

6. The method of claim 5, wherein the target material film includes titanium nitride (TiN) having a resistivity variation of 1% and a resistivity of less than 10 μΩ-cm.

7. The method of claim 1, wherein the plurality of magnetic columns include permanent magnetic material.

8. The method of claim 1, wherein the target material film includes a material selected from the group consisting of aluminum (Al), copper (Cu), tungsten (W), molybdenum (Mo), tantalum (Ta), titanium (Ti), tantalum nitride (TaN), tungsten nitride ($W_2N$, WN, or $WN_2$), titanium nitride (TiN), aluminum nitride (AlN), and scandium aluminum nitride (ScAlN or $Sc_xAl_xN$).

9. A method of manufacturing a semiconductor device using a semiconductor processing chamber, wherein the semiconductor processing chamber includes: a magnetic assembly including a plurality of magnetic columns positioned on the semiconductor processing chamber, the method comprising:
   monitoring an erosion uniformity of a target material in the semiconductor processing chamber and a thickness uniformity of a film of the target material deposited on a semiconductor substrate positioned in the semiconductor processing chamber, wherein monitoring the thickness uniformity includes measuring a resistivity of the deposited film of the target material at different regions of the semiconductor substrate to determine a thickness of the deposited film of the target material in each of the different regions of the semiconductor substrate;
   when the erosion uniformity of the target material and/or the thickness uniformity of the deposited film of the target material exceeds a corresponding threshold, removing three magnetic columns of the plurality of magnetic columns from the magnetic assembly such that the target material is eroded in a substantially uniform manner and a film having a substantially uniform thickness is deposited on the semiconductor substrate; and
   performing a semiconductor manufacturing process on the semiconductor substrate using the magnetic assembly after the removing three magnetic columns.

10. The method of claim 9, further comprising:
    decreasing a spacing between the target material and the semiconductor substrate; and
    performing the semiconductor manufacturing process to deposit the film of the target material after decreasing the spacing.

11. The method of claim 10, wherein the spacing is decreased to around 53 mm from around 60 mm.

12. The method of claim 11, wherein the film of the target material includes titanium nitride (TiN) having a resistivity variation of 1% and a resistivity of less than 10 μΩ-cm.

13. The method of claim 9, wherein the semiconductor manufacturing process includes a deposition operation or an etching operation.

14. The method of claim 9, wherein the plurality of magnetic columns include permanent magnets.

15. The method of claim 9, wherein removing the three magnetic columns of the plurality of magnetic columns from the magnetic assembly includes removing the three magnetic columns such that a magnetic flux density due to the plurality of magnetic columns is substantially uniform.

16. The method of claim 9, wherein the plurality of magnetic columns are arranged in two or more groups, and removing the three magnetic columns of the plurality of magnetic columns includes removing magnetic columns from one or more of the two or more groups.

17. A method, comprising:
    sputter depositing a film on a semiconductor substrate disposed within a vacuum chamber including a target, wherein a magnetic assembly including a plurality of magnets is positioned over the vacuum chamber;
    measuring a magnetic flux density distribution formed by the plurality of magnets in the magnetic assembly;

measuring a thickness uniformity of the film by measuring a resistivity of the film at different regions of the semiconductor substrate to determine a thickness of the film in each of the different regions of the semiconductor substrate;

based on the measured magnetic flux density distribution and the measured thickness uniformity of the film, adjusting positions of one or more magnets of the plurality of magnets relative to another magnet of the plurality of magnets along a direction away from the target; and after adjusting positions of one or more magnets, performing a sputtering operation using the vacuum chamber housing the target.

18. The method of claim 17, wherein the positions of the one or more magnets are adjusted such that a substantially uniform magnetic flux density distribution is generated.

19. The method of claim 17, wherein measuring the magnetic flux density distribution comprises generating a map of the magnetic flux density distribution relative to the plurality of magnets.

20. The method of claim 17, wherein adjusting the positions of the one or more magnets comprises removing one or more magnets from the magnetic assembly.

* * * * *